(12) United States Patent
Kang et al.

(10) Patent No.: US 12,310,014 B2
(45) Date of Patent: May 20, 2025

(54) SELECTION GATE SEPARATION FOR 3D NAND

(71) Applicant: Applied Materials, Inc., Santa Clara, CA (US)

(72) Inventors: Chang Seok Kang, Santa Clara, CA (US); Tomohiko Kitajima, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 416 days.

(21) Appl. No.: 17/399,275

(22) Filed: Aug. 11, 2021

(65) Prior Publication Data

US 2022/0059555 A1 Feb. 24, 2022

Related U.S. Application Data

(60) Provisional application No. 63/066,871, filed on Aug. 18, 2020.

(51) Int. Cl.
*H01L 27/11524* (2017.01)
*G11C 8/14* (2006.01)
*G11C 16/04* (2006.01)
*H10B 41/27* (2023.01)
*H10B 41/35* (2023.01)

(52) U.S. Cl.
CPC ............ *H10B 41/35* (2023.02); *G11C 8/14* (2013.01); *G11C 16/0483* (2013.01); *H10B 41/27* (2023.02)

(58) Field of Classification Search
CPC ........ H10B 41/35; H10B 41/27; H10B 43/27; H10B 43/35; G11C 8/14; G11C 16/0483
See application file for complete search history.

(56) References Cited

U.S. PATENT DOCUMENTS

| | | | |
|---|---|---|---|
| 9,343,358 B1* | 5/2016 | Xu | H01L 21/76202 |
| 10,943,919 B2* | 3/2021 | Kobayashi | H10B 41/27 |
| 10,985,178 B2* | 4/2021 | Kashima | G11C 5/063 |
| 11,024,371 B2 | 6/2021 | Cui et al. | |
| 11,264,399 B2* | 3/2022 | Lee | H10B 43/35 |

(Continued)

FOREIGN PATENT DOCUMENTS

| | | |
|---|---|---|
| JP | 2019046916 A | 3/2019 |
| JP | 2019079885 A | 5/2019 |

OTHER PUBLICATIONS

PCT International Search Report and Written Opinion in PCT/US2021/046096 dated Dec. 6, 2021, 8 pages.

*Primary Examiner* — Jarrett J Stark
(74) *Attorney, Agent, or Firm* — SERVILLA WHITNEY LLC

(57) ABSTRACT

Described is a memory string including at least one select gate for drain (SGD) transistor and at least one memory transistor in a vertical hole extending through a memory stack on a substrate. The memory stack comprises alternating non-replacement word lines and replacement insulators. A filled slit extends through the memory stack, and there are at least two select gate for drain (SGD) isolation regions in the memory stack adjacent the filled slit. A select-gate-for-drain (SGD) cut is patterned into the top few pairs of alternating layers in the memory stacks. Through the cut opening, the sacrificial layer of the memory stacks is removed, and an insulator layer is used to fill the opening.

19 Claims, 13 Drawing Sheets

(56) References Cited

U.S. PATENT DOCUMENTS

| | | | |
|---|---|---|---|
| 2015/0348984 A1 | 12/2015 | Yada et al. | |
| 2016/0064079 A1 | 3/2016 | Alsmeier | |
| 2016/0163729 A1* | 6/2016 | Zhang | H01L 29/792 |
| | | | 257/324 |
| 2016/0204117 A1 | 7/2016 | Liu et al. | |
| 2016/0322378 A1* | 11/2016 | Ito | H10B 43/27 |
| 2017/0213845 A1* | 7/2017 | Baba | H10B 43/27 |
| 2017/0278864 A1 | 9/2017 | Hu et al. | |
| 2018/0138292 A1* | 5/2018 | Padilla | H10B 63/845 |
| 2018/0144977 A1 | 5/2018 | Yu et al. | |
| 2018/0294273 A1* | 10/2018 | Liao | G11C 16/0408 |
| 2018/0330985 A1 | 11/2018 | Yu et al. | |
| 2018/0358550 A1* | 12/2018 | Kamalanathan | H10N 70/8833 |
| 2019/0198065 A1* | 6/2019 | Russo | G11C 7/1096 |
| 2019/0333581 A1* | 10/2019 | Diep | G11C 16/10 |
| 2019/0333929 A1* | 10/2019 | Lee | H10B 41/20 |
| 2020/0027509 A1* | 1/2020 | Chen | H01L 24/08 |
| 2020/0027892 A1* | 1/2020 | Zhu | H10B 43/40 |
| 2020/0185408 A1 | 6/2020 | Song et al. | |
| 2020/0350014 A1 | 11/2020 | Liu | |
| 2020/0350287 A1 | 11/2020 | Liu | |
| 2020/0402562 A1 | 12/2020 | Li et al. | |
| 2020/0411509 A1 | 12/2020 | Yang et al. | |
| 2021/0043643 A1 | 2/2021 | Lu et al. | |
| 2021/0126005 A1 | 4/2021 | Lu et al. | |
| 2021/0210142 A1 | 7/2021 | Liu | |
| 2021/0225865 A1 | 7/2021 | Wu | |
| 2021/0249436 A1 | 8/2021 | Ding et al. | |
| 2021/0257385 A1 | 8/2021 | Hu et al. | |
| 2021/0257386 A1 | 8/2021 | Wang et al. | |
| 2021/0257387 A1 | 8/2021 | Huang et al. | |

* cited by examiner

SELECTION GATE SEPARATION FOR 3D NAND

CROSS-REFERENCE TO RELATED APPLICATIONS

This application claims priority to U.S. Provisional Application No. 63/066,871, filed Aug. 18, 2020, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide 3D-NAND select transistors and methods for forming.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Current 3D-NAND devices, which have a memory stack comprising alternating layers of an oxide material and a nitride material, have multiple memory holes between two slits. For the access to each cell by a word line and bit line, the memory holes between slits needs to be divided by select gate at drain (SGD) cut. For example, Toshiba 96L stacked 3D NAND with 8 memory holes and one dummy hole has one SGD cut separates the holes into two groups. In order to reduce the array size of 3D-NAND, the number of holes between slits (nHole) needs to be increased. If nHole increases more than 8 holes, there needs to be more than one SGD cut for the same technology. The holes under the same bit line level should be separately accessible by a combination of bit line (BL) and word line (WL). In other words, holes under same bit line are selected independently by a select gate for drain (SGD) and bit line. For this purpose, SGDs between slits should be separated by an SGD-cut. When the number of holes between slits (nHole) is small, e.g., ≤8, one SGD-cut separate select gate for drains (SGDs). However, when the number of holes between slits (nHole) is large, e.g., ≥12), SGD-cut needs to be added for every four holes.

Accordingly, there is a need in the art for 3D-NAND devices and methods of fabricating 3D-NAND devices having a select gate for drain (SGD) cut.

SUMMARY

One or more embodiments of the disclosure are directed to a semiconductor memory device. In one or more embodiments, a semiconductor memory device comprises: a memory string including at least one select gate for drain (SGD) transistor and at least one memory transistor in a vertical hole extending through a memory stack on a substrate, the memory stack comprising alternating non-replacement word line and replacement insulator; a filled slit extending through the memory stack; and at least two selected gate for drain (SGD) isolation regions in the memory stack adjacent the filled slit.

Additional embodiments of the disclosure are directed to a method of forming a semiconductor device. In one or more embodiments, a method of forming a semiconductor device having a three-dimensional vertical memory string including a select gate for drain (SGD) transistor and a memory transistor comprises: forming a first opening in a memory stack comprising alternating layers of a first layer and a second layer on a substrate; recessing the second layer through the first opening to form a first recessed region; forming a selection-gate-for-drain (SGD) isolation in the first opening and in the first recessed region; forming a memory string formation through the memory stack; forming a slit extending from a top surface of the memory stack to the substrate; removing the second layers to form a second opening; and filling the second opening and the slit with an insulating material.

Further embodiments of the disclosure are directed to non-transitory computer readable medium. In one or more embodiments, a non-transitory computer readable medium includes instructions, that, when executed by a controller of a processing chamber, causes the processing chamber to perform the operations of: form a first opening in a memory stack comprising alternating layers of a first layer and a second layer on a substrate; recess the second layer through the first opening to form a first recessed region; form a selection-gate-for-drain (SGD) isolation in the first opening and in the first recessed region; form a memory string formation through the memory stack; form a slit extending from a top surface of the memory stack to the substrate; remove the second layers to form a second opening; and fill the second opening and the slit with an insulating material.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
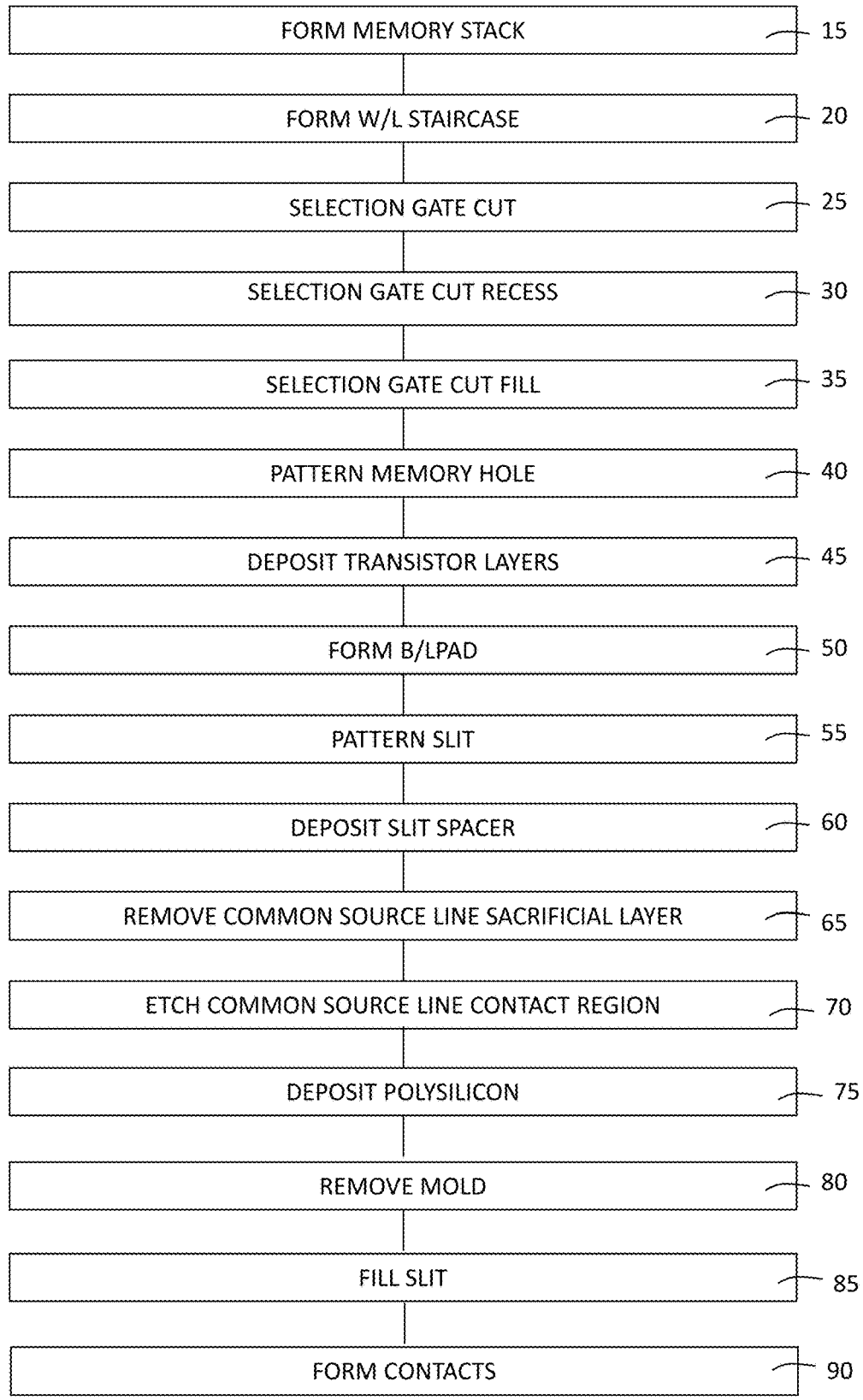
FIG. 1 illustrates a process flow diagram of a method of forming a memory device according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

In existing 3D NAND devices based on a memory stack of alternating layers of an oxide material and a nitride material, a select-gate-for-drain (SGD) cut cannot be formed using current integration schemes, e.g., select-gate-for-drain before word line replacement when there exists more than one SGD-cut. In current integration schemes, the SGD formed before replacement blocks replacement of word lines between SGD-cuts. In order to reduce the array size of 3D-NAND, the number of memory strings (e.g., holes) between slits (nHole) needs to be increased. The holes under the same bit line level should be separately accessible by a combination of bit line (BL) and word line (WL). In other words, holes under same bit line are selected independently by a select gate for drain (SGD) and bit line. For this purpose, SGDs between slits should be separated by an SGD-cut. When the number of holes between slits (nHole) is small, e.g., ≤8, one SGD-cut separate select gate for drains (SGDs). However, when the number of holes between slits (nHole) is large, e.g., ≥12), SGD-cut needs to be added for every four holes. Accordingly, one or more embodiments provide 3D NAND structures and method of fabricating select-gate-for-drain cuts using a non-replacement gate integration scheme.

One or more embodiments provide non-replacement word lines a memory string including at least one select gate for drain (SGD) transistor and at least one memory transistor in a vertical hole extending through a memory stack on a substrate. In one or more embodiments, the memory stack comprises alternating non-replacement word line and replacement insulator. A filled slit extends through the memory stack, and there are at least two select gate for drain (SGD) isolation regions in the memory stack adjacent the filled slit. A select-gate-for-drain (SGD) cut is patterned into the top few pairs of alternating layers in the memory stacks. Through the cut opening, the sacrificial layer of the memory stacks is removed, and an insulator layer is used to fill the opening.

The device and fabrication method of one or more embodiments advantageously permit select-gate-for-drain separation regardless of the number of holes (memory strings) between slits. As a result, the bit density per area is increased, thus reducing the cost of producing the 3D NAND devices.

In one or more embodiments, metal deposition and other processes can be carried out in an isolated environment (e.g., a cluster process tool). Accordingly, some embodiments of the disclosure provide integrated tool systems with related process modules to implement the methods.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a word line staircase is formed in the memory stack. At operation 25, a selection gate is etched/cut into the memory stack staircase. At operation 30, the second layer, e.g., metal, metal nitride, conductive metal compound, or semiconductor material, may be recessed through the selection gate cut. At operation 35, the selection gate cut is filled with a dielectric material. At operation 40, a memory is patterned. At operation 45, transistor layers are deposited in the memory hole. At operation 50, the bit line pad is formed. At operation 55, the memory staircase is slit patterned. At operation 60, a slit spacer is deposited. At operation 65, the sacrificial layer of the common source line is removed. At operation 70, the common source line contact region is etched. At operation 75, polysilicon is deposited in the common source line contact region. At operation 80, the mold is removed. At operation 85, the slit is filled with a dielectric material, and, at operation 90, back-end-of-the-line (BEOL) contacts are formed.

FIGS. 2-17 illustrate a portion of a memory device 100 following the process flow illustrated for the method 10 in FIG. 1.

Figure 2:
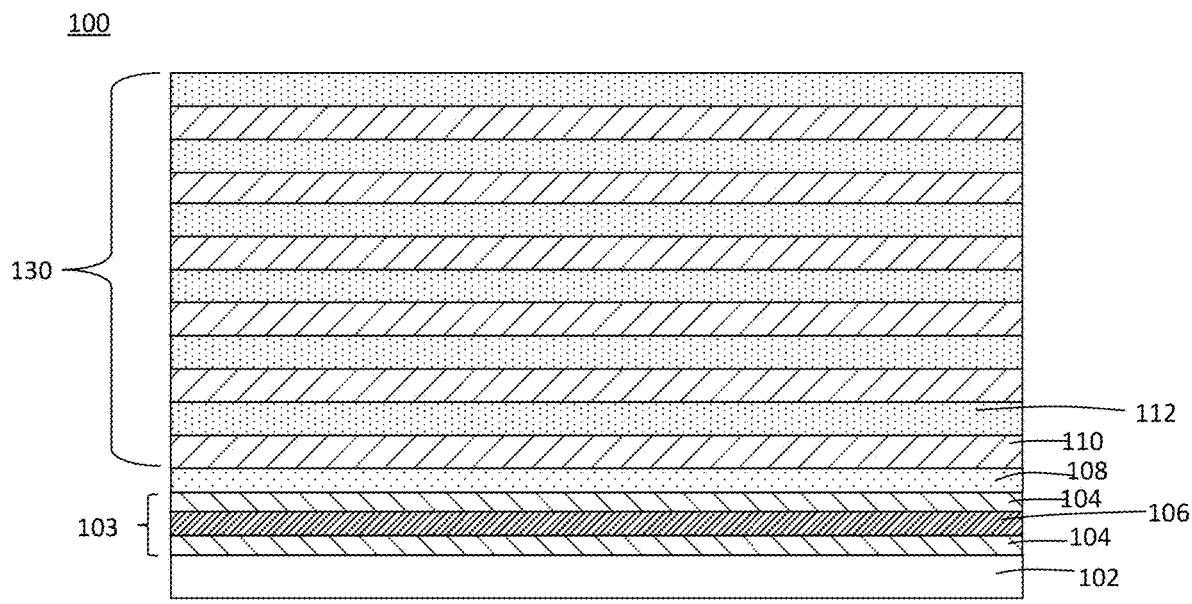
FIG. 2 illustrates a cross-sectional view of an electronic device with a memory stack according to one or more embodiments.

FIG. 2 illustrates an initial or starting memory stack of an electronic device 100 in accordance with one or more embodiments of the disclosure. In some embodiments, the electronic device 100 shown in FIG. 2 is formed on the bare substrate 102 in layers, as illustrated. The electronic device of FIG. 2 is made up of a substrate 102, a common source line 103, and a memory stack 130.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, a common source line 103 is on the substrate 102. The common source line 103 may also be referred to as the semiconductor layers. The common source line 103 can be formed by any suitable technique known to the skilled artisan and can be made from any suitable material including, but not limited to, poly-silicon (poly-Si). In some embodiments, the common source line 103 comprises several different conductive or a semiconductor materials. For example, in one or more embodiments, as illustrated in FIG. 2, the common source line 103 comprises a poly-silicon layer 104 on the substrate 102, a sacrificial layer 106 on the polysilicon layer, a second polysilicon layer 104 on the sacrificial layer 106, and an oxide layer 108 on the second polysilicon layer 104.

In one or more embodiments, a sacrificial layer 106 may formed on the polysilicon layer 104 and can be made of any suitable material. The sacrificial layer 106 in some embodiments is removed and replaced in later processes. In some embodiments, the sacrificial layer 106 is not removed and remains within the memory device 100. In this case, the term "sacrificial" has an expanded meaning to include permanent layers and may be referred to as the conductive layer. In the illustrated embodiment, as described further below, the sacrificial layer 106 is removed in operation 65. In one or more embodiments, the sacrificial layer 106 comprises a material that can be removed selectively versus the neighboring polysilicon layer 104. In one or more embodiments, the sacrificial layer comprises a nitride material, e.g., silicon nitride (SiN), or an oxide material, e.g., silicon oxide (SiOx).

In one or more embodiments, a memory stack 130 is formed on the oxide layer 108 on the common source line 103. The memory stack 130 in the illustrated embodiment comprises a plurality of alternating first layers 110 and second layers 112. In some embodiments, the memory stack 130 may be referred to as an "XM" stack, where "X" is X is a sacrificial non-insulating layer and "M" is a metal. In the embodiments described herein, "M" is referred to as the first layers 110 and "X" is referred to as the second layers 112. In one or more embodiments, the second layers 112 comprise a material that is etch selective relative to the first layers 110 so that the second layers 112 can be removed without substantially affecting the first layers 110.

In one or more embodiments, the "M" layers or first layers 110 comprise a metal or a semiconductor. In one or more embodiments, the metal of the first layers 110 is selected from one or more of tungsten (W), molybdenum (Mo), tantalum (Ta), ruthenium (Ru), niobium (Nb), osmium (Os), zirconium (Zr), iridium (Ir), rhenium (Re), titanium (Ti), silicon (Si), silicon germanium (SiGe), and germanium (Ge).

In one or more embodiments, the "X" layers or second layers 112 comprise one or more of metal, metal nitride, conductive metal compound, a dielectric material, and a semiconductor material. In one or more embodiments, the metal of the second layers 112 is selected from one or more of tungsten (W), molybdenum (Mo), tantalum (Ta), niobium (Nb), osmium (Os), zirconium (Zr), iridium (Ir), rhenium (Re), or titanium (Ti). In one or more embodiments, the metal nitride of the second layers 112 is selected from one or more of titanium nitride (TiN), tantalum nitride (TaN), tungsten nitride (WN), molybdenum nitride (MoN), and zirconium nitride (ZrN). In one or more embodiments, the conductive metal compound of the second layers 112 is selected from one or more of tungsten oxide (WOx), ruthenium oxide (RuOx), and iridium oxide (IrOx). In one or more embodiments, the dielectric material of the second layers 112 is selected from one or more of silicon nitride (SiN), silicon oxide ($SiO_2$), and tungsten oxide ($WO_3$). In one or more embodiments, the semiconductor material of the second layers 112 is selected from one or more of silicon (Si), silicon germanium (SiGe), and germanium (Ge).

In one or more embodiments, the dielectric material may comprise any suitable dielectric material known to the skilled artisan. As used herein, the term "dielectric material" refers to an electrical insulator that can be polarized in an electric field. In some embodiments, the dielectric material comprises one or more of oxides, carbon doped oxides, porous silicon dioxide ($SiO_2$), silicon dioxide (SiO), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

In one or more embodiments first layers 110 and second layers 112 are deposited by chemical vapor deposition (CVD) or physical vapor deposition (PVD). The individual alternating layers may be formed to any suitable thickness.

In some embodiments, the thickness of each second layer 112 is approximately equal. In one or more embodiments, each second layer 112 has a first second layer thickness. In some embodiments, the thickness of each first layer 110 is approximately equal. As used in this regard, thicknesses which are approximately equal are within +/−5% of each other. In one or more embodiments, the first layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layers 112 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm.

Figure 3:
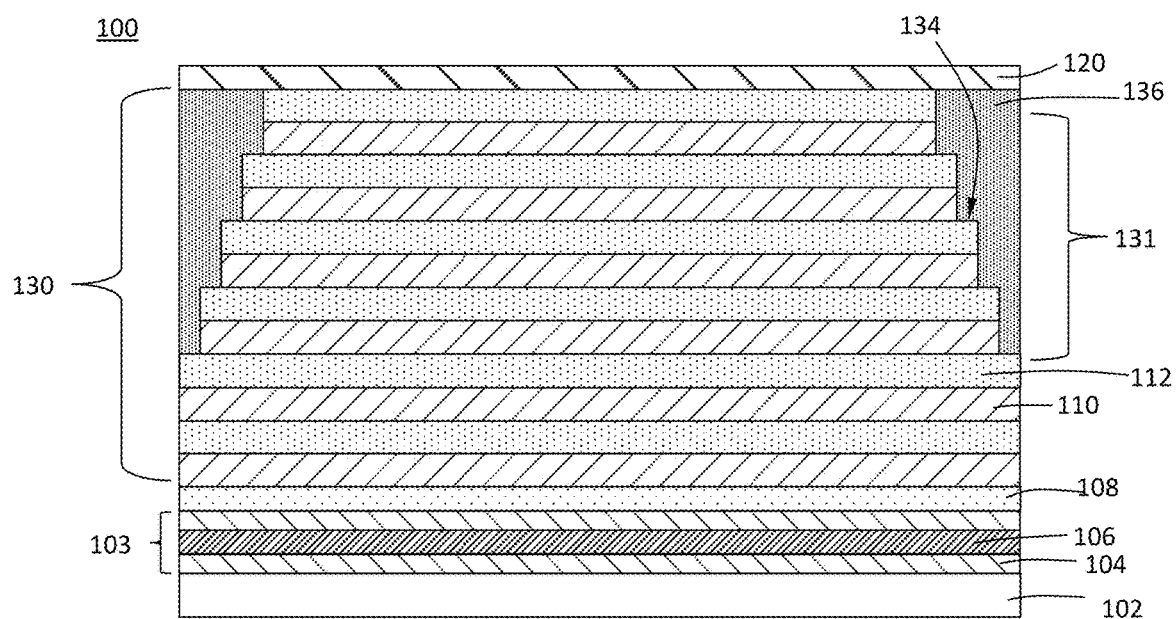
FIG. 3 illustrates a cross-sectional view of an electronic device after forming a staircase pattern of the memory stack according to one or more embodiments.

Referring to FIG. 3, at operation 20 of method 10, a staircase formation 131 is created. A mask layer 120 is deposited on the top surface of the memory stack 130. The mask layer 120 may comprise any suitable material known to the skilled artisan. In one or more embodiments the mask layer 120 comprises a nitride.

In one or more embodiments, the staircase formation 131 exposes a top surface 134 of the "X" layer or second layers 112. The top surface 134 can be used to provide space for word line contacts to be formed, as described below. A suitable fill material 136 can be deposited to occupy the space outside the staircase formation 131. A suitable fill material 136, as will be understood by the skilled artisan, can be any material that prevents electrical shorting between adjacent word lines. A staircase formation 131 with each word line having a smaller width (illustrated from left-to-right in the figures) than the word line below. Use of relative terms like "above" and "below" should not be taken as limiting the scope of the disclosure to a physical orientation in space.

Figure 4:
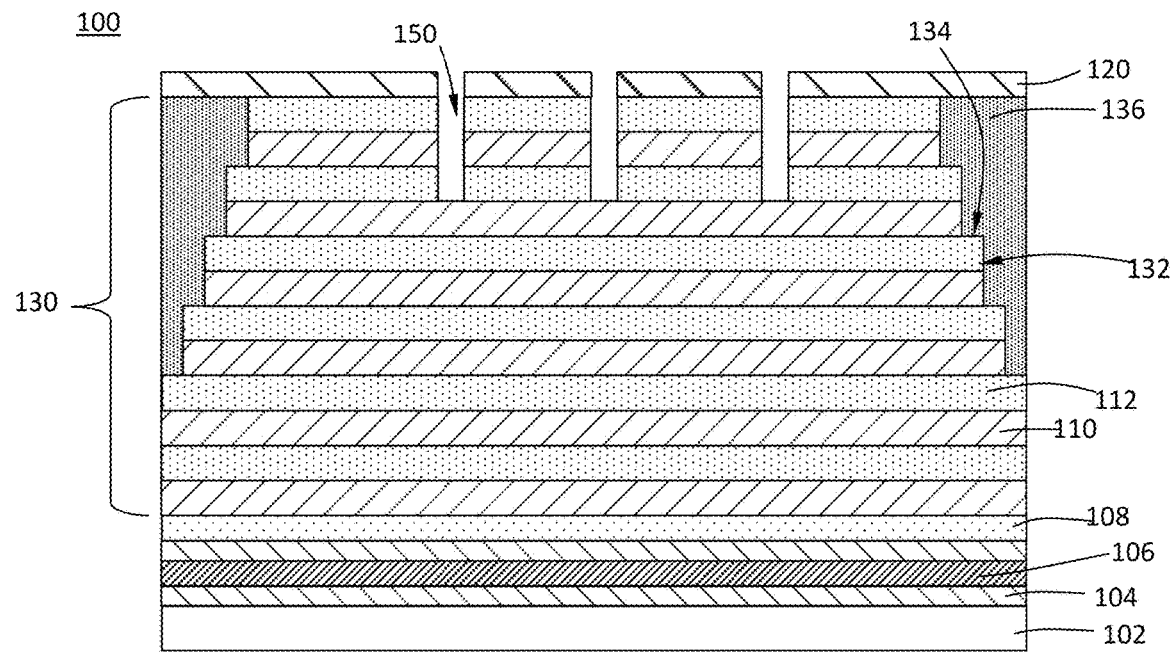
FIG. 4 illustrates a cross-sectional view of an electronic device according to one or more embodiments.

Referring to FIG. 4, at operation 25, a selection gate is etched/cut into the memory stack forming a first opening 150. In some embodiments, this may be referred to as patterning a select-gate-for-drain cut (SGD). The first opening 150 extends from a top surface of the mask layer 120 to a top surface of one of the "M" layers or first layers 110. The etching/patterning may be conducted by any suitable means known to the skilled artisan. In one or more embodiments, forming the first opening comprises a selection-gate-for-drain (SGD) separation etch.

Figure 5:
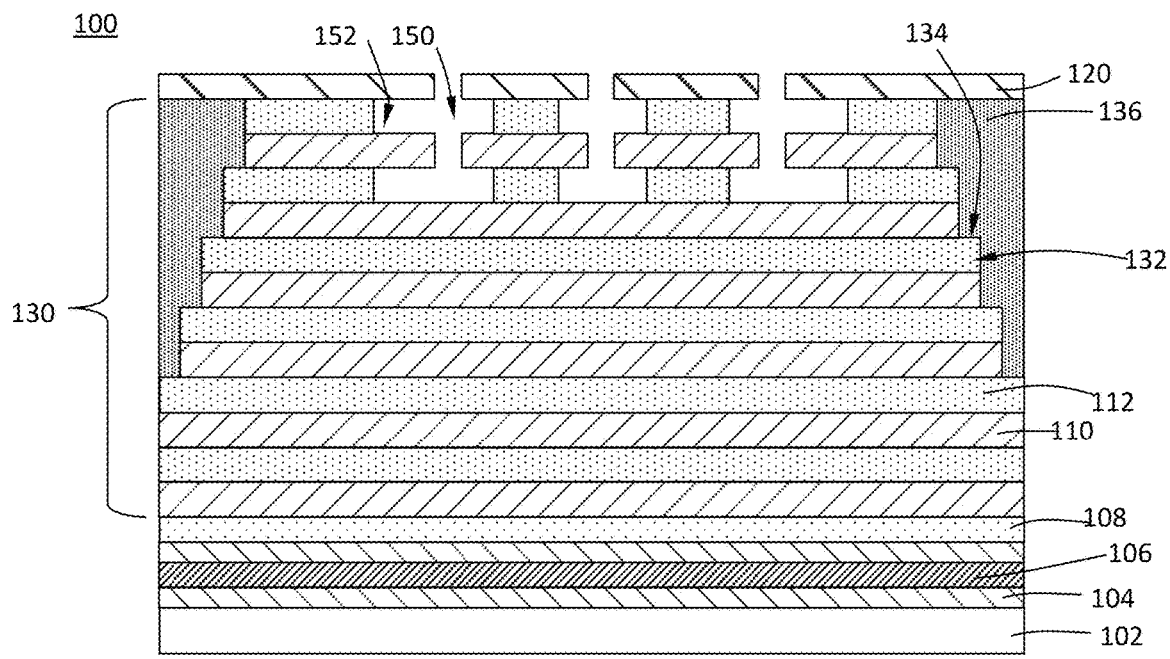
FIG. 5 illustrates a cross-sectional view of an electronic device according to one or more embodiments.

With reference to FIG. 5, at operation 30, the "X" layer or second layers 112 are recessed through first 150 to form a recessed opening 152. In one or more embodiments, the first opening has a pitch in a range of from about 20 nm to about 60 nm, and the second layer is recessed an amount that is about 100 nm to about 300 nm, about two times the pitch of the memory hole.

Figure 6:
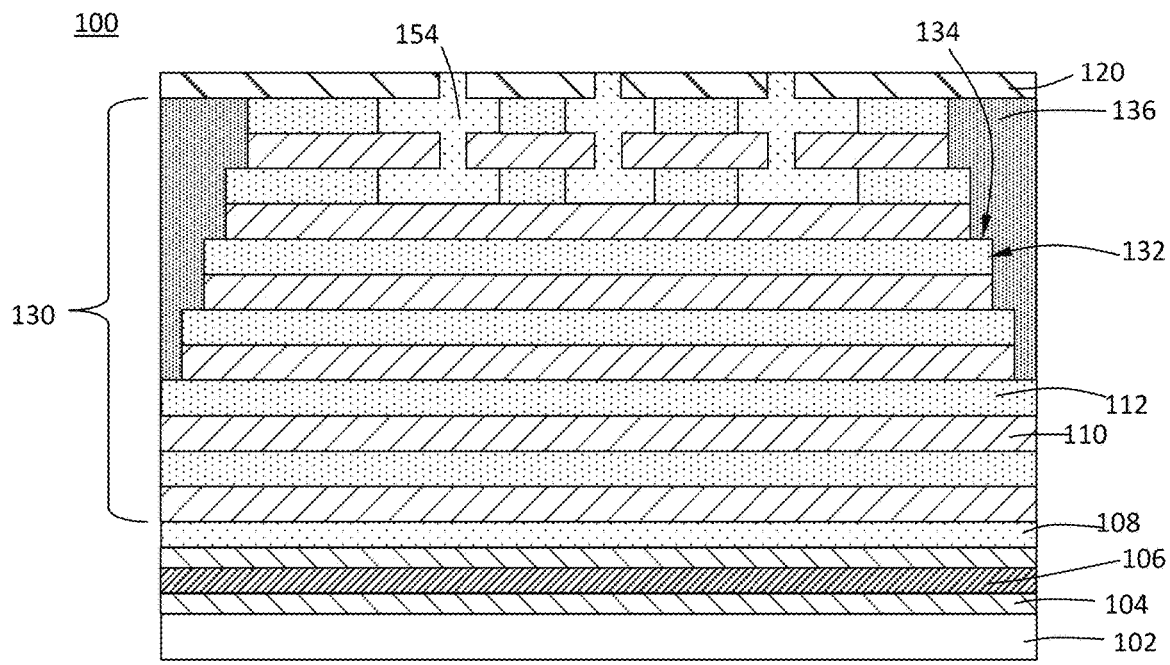
FIG. 6 illustrates a cross-sectional view of an electronic device according to one or more embodiments.

Referring to FIG. 6, at operation 35, a selection-gate-for-drain (SGD) isolation is formed in the first opening 150 and in the recessed region 152. In one or more embodiments, forming the selection-gate-for-drain (SGD) isolation comprises depositing an oxide material 154 in the first opening 150 and in the recessed region 152. The oxide material 154 may be deposited by any suitable method known to the skilled artisan. In one or more embodiments, the oxide material 154 is deposited by atomic layer deposition (ALD). In one or more embodiments, the oxide material 154 comprises silicon oxide ($SiO_x$) or silicon oxynitride (SiON).

Figure 7:
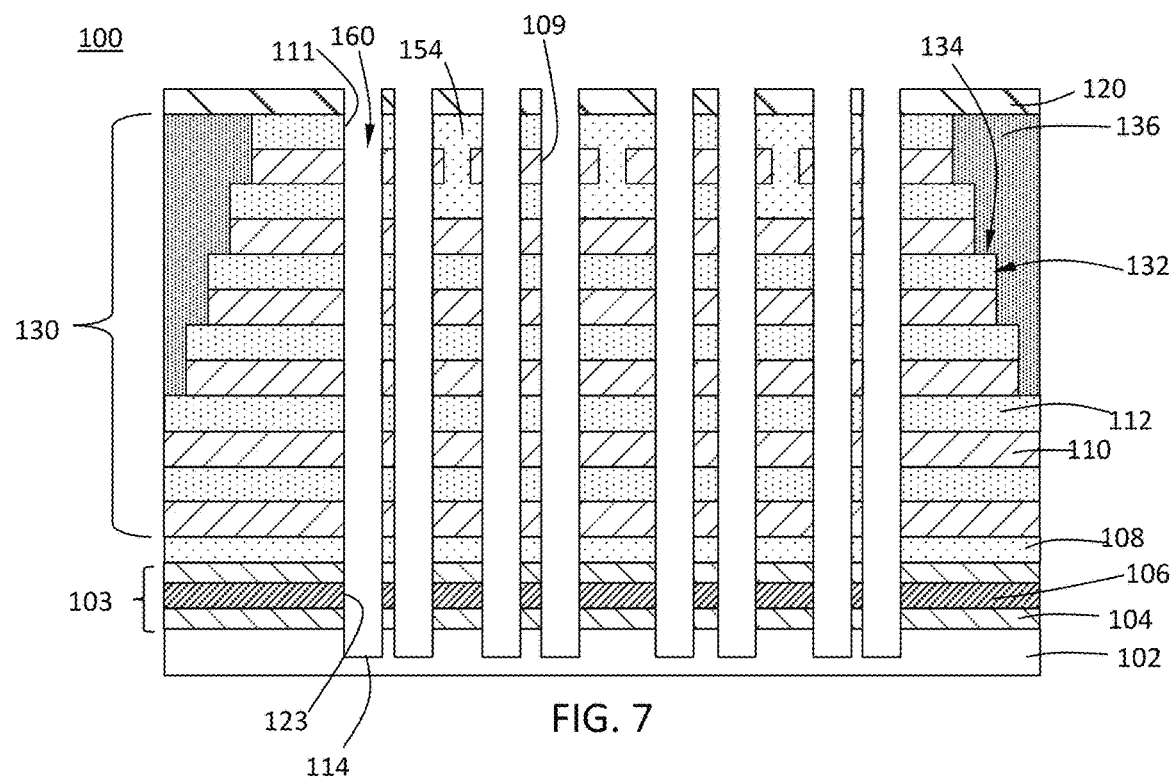
FIG. 7 illustrates a cross-sectional view of an electronic device according to one or more embodiments.

FIGS. 7-9B illustrate the formation of a memory string through the memory stack 130. With reference to FIG. 7, at operation 40 a memory hole channel 160 is opened/patterned through the memory stack 130. In some embodiments, opening the memory hole channel 160 comprises etching through the mask layer 120, memory stack 130, common source line 103, and into substrate 102. The memory hole channel 160 has sidewalls that extend through the memory stack 130 exposing surfaces 111 of the second layers 112 and surfaces 109 of the first layers 110.

The sacrificial layer 106 has surfaces 123 exposed as sidewalls of the memory hole channel 160. The memory hole channel 160 extends a distance into the substrate 102 so that sidewall surface 123 and bottom 114 of the memory hole channel 160 are formed within the substrate 102. The bottom 114 of the memory hole channel 160 can be formed at any point within the thickness of the substrate 102. In some embodiments, the memory hole channel 160 extends a thickness into the substrate 102 in the range of from about 10% to about 90%, or in the range of from about 20% to about 80%, or in the range of from about 30% to about 70%, or in the range of from about 40% to about 60% of the thickness of the substrate 102. In some embodiments, the memory hole channel 160 extends a distance into the substrate 102 by greater than or equal to 10%, 20%, 30%, 40%, 50%, 60%, 70% or 80% of the thickness of the substrate 102.

Figure 8A:
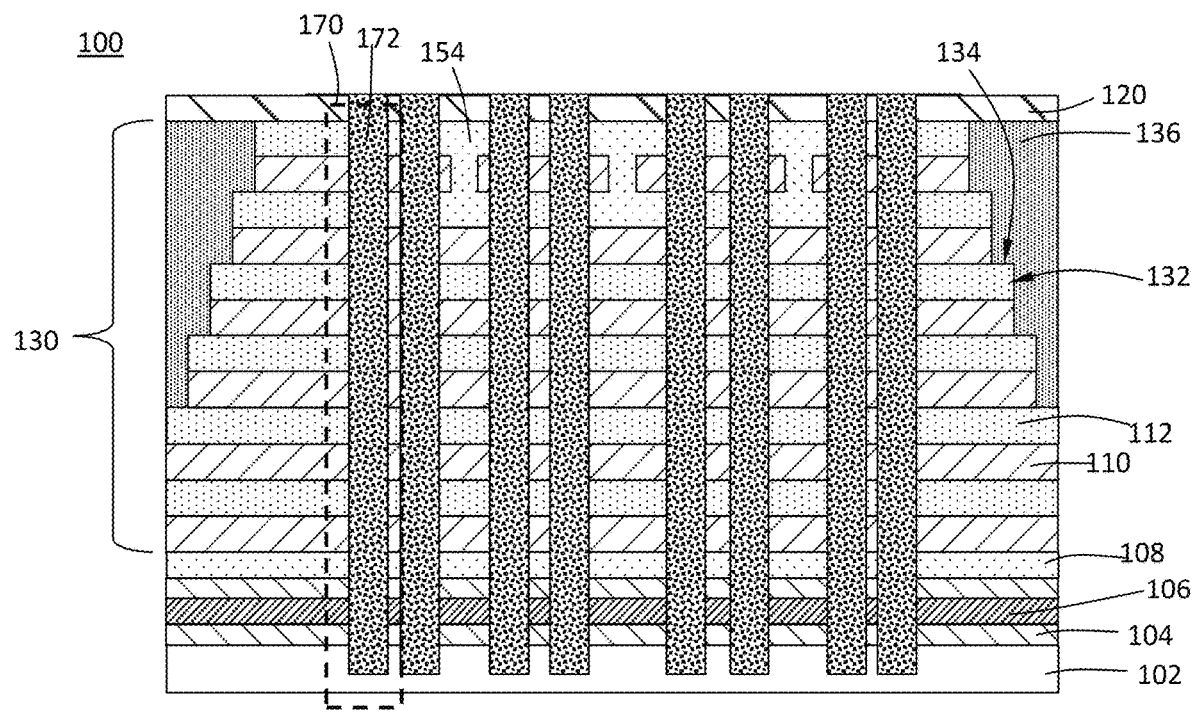
FIG. 8A illustrates a cross-sectional view of an electronic device according to one or more embodiments.

FIG. 8A shows operation 45 in which the transistor layers 172 are formed in the memory hole channel 160. The transistor layers 172 can be formed by any suitable technique known to the skilled artisan. In some embodiments, the transistor layers are formed by a conformal deposition process. In some embodiments, the transistor layers are formed by one or more of atomic layer deposition or chemical vapor deposition.

In one or more embodiments, the deposition of the transistor layers 172 is substantially conformal. As used herein, a layer which is "substantially conformal" refers to a layer where the thickness is about the same throughout (e.g., on the top, middle and bottom of sidewalls and on the bottom of the memory hole channel 160). A layer which is substantially conformal varies in thickness by less than or equal to about 5%, 2%, 1% or 0.5%.

Figure 8B:
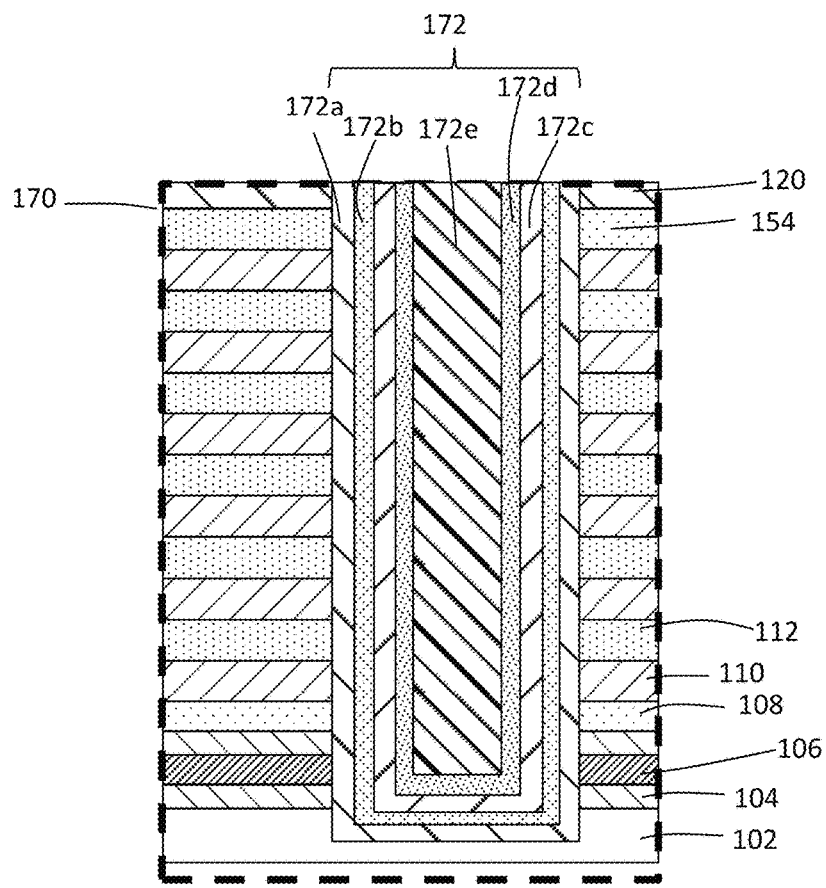
FIG. 8B illustrates an expanded view of region 170 according to one or more embodiments.

Referring to FIG. 8B, which is an expanded view of region 170 of FIG. 8A, in one or more embodiments, the transistor layers 172 comprises an aluminum oxide layer 172a, a blocking oxide layer 172b, a nitride trap layer 172c, a tunnel oxide layer 172c, and a channel material 172e in the memory hole channel 160. In one or more embodiments, the channel material 172e comprises poly-silicon. In one or more embodiments, the aluminum oxide layer 172a is deposited in the memory hole channel 160 on the sidewalls of the memory hole channel 160.

The transistor layers 172 can have any suitable thickness depending on, for example, the dimensions of the memory hole channel 160. In some embodiments, the transistor layers 172 have a thickness in the range of from about 0.5 nm to about 50 nm, or in the range of from about 0.75 nm to about 35 nm, or in the range of from about 1 nm to about 20 nm.

In one or more embodiments, the transistor layers 172 comprises one or more of a select-gate-for-drain (SGD) transistor or a memory transistor, and the transistor layers 172 independently comprise one or more transistor layers selected from aluminum oxide (AlO), a blocking oxide, a trap material, a tunnel oxide, and a channel material.

Figure 9A:
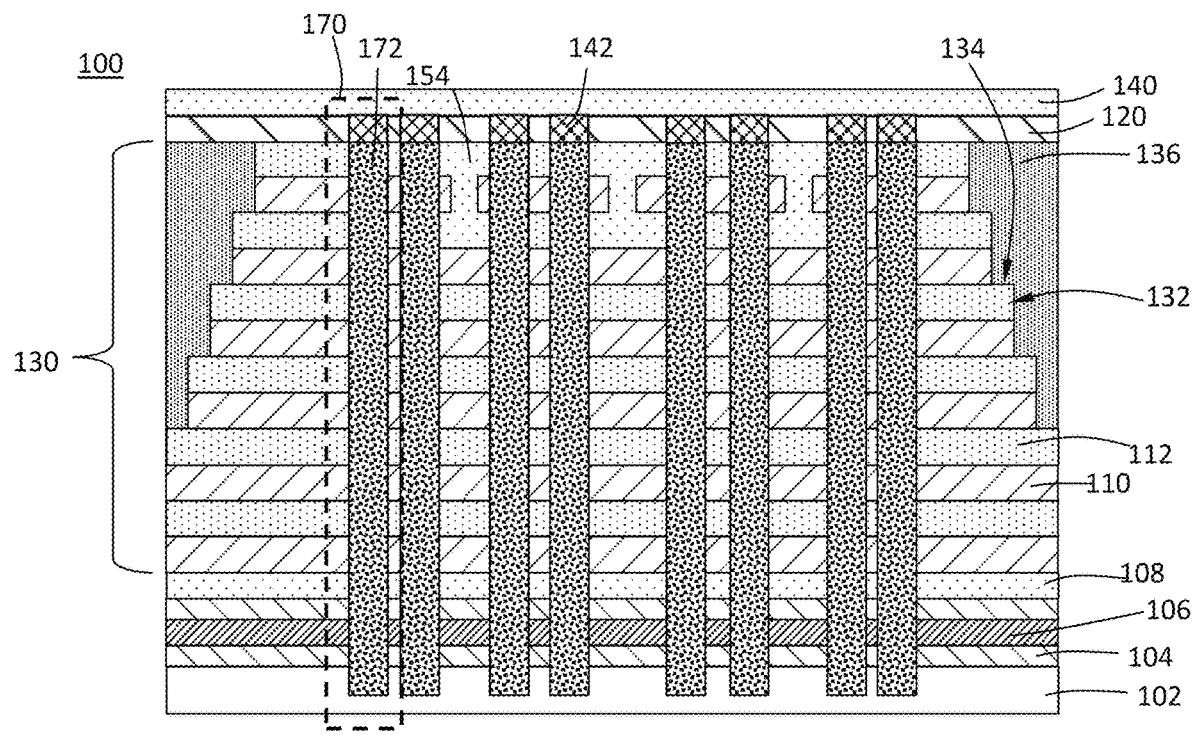
FIG. 9A illustrates a cross-sectional view of an electronic device according to one or more embodiments.
Figure 9B:
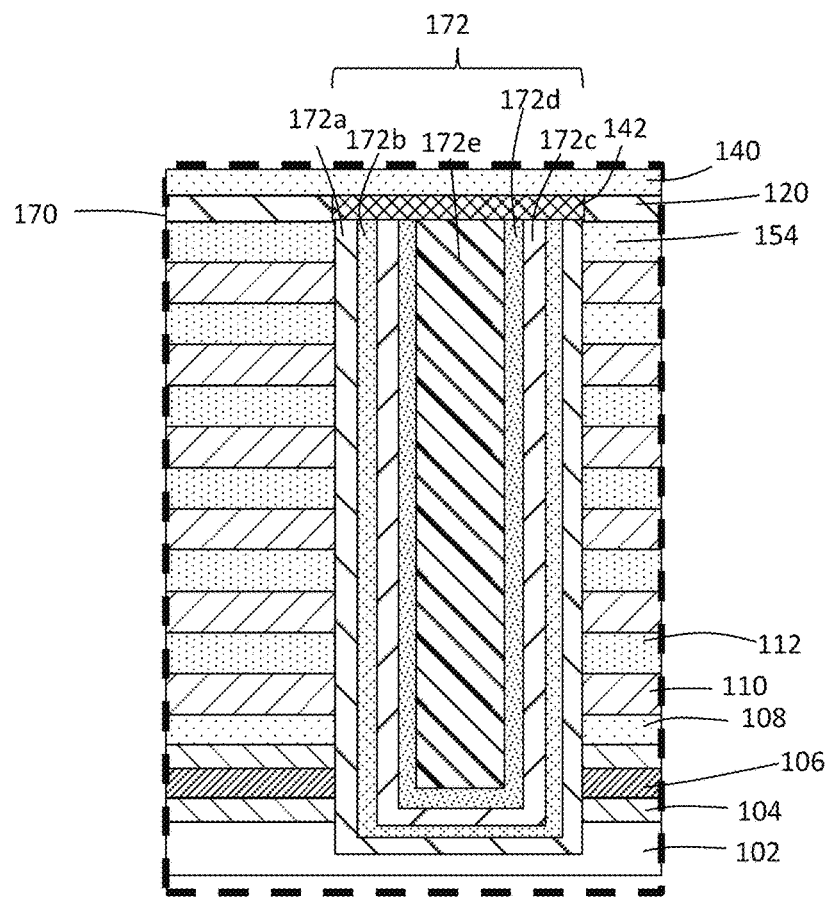
FIG. 9B illustrates an expanded view of region 170 according to one or more embodiments.

FIGS. 9A-9B show operation 50 of method 10 where a bit line pad 142 is formed in the mask layer 120. The bit line pad 142 can be any suitable material known to the skilled artisan including, but not limited to, poly-silicon.

Referring to FIGS. 9A and 9B, an interlayer dielectric layer 140 is deposited on a top surface of the mask layer 120 and the bit line pad 142. The interlayer dielectric (ILD) layer 140 may be deposited by any suitable technique known to one of skill in the art. The interlayer dielectric layer 140 may comprise any suitable material known to one of skill in the art. In one or more embodiments, the interlayer dielectric layer 140 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the interlayer dielectric layer 140, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, aluminum oxide, zirconium oxide, and the like.

Figure 10:
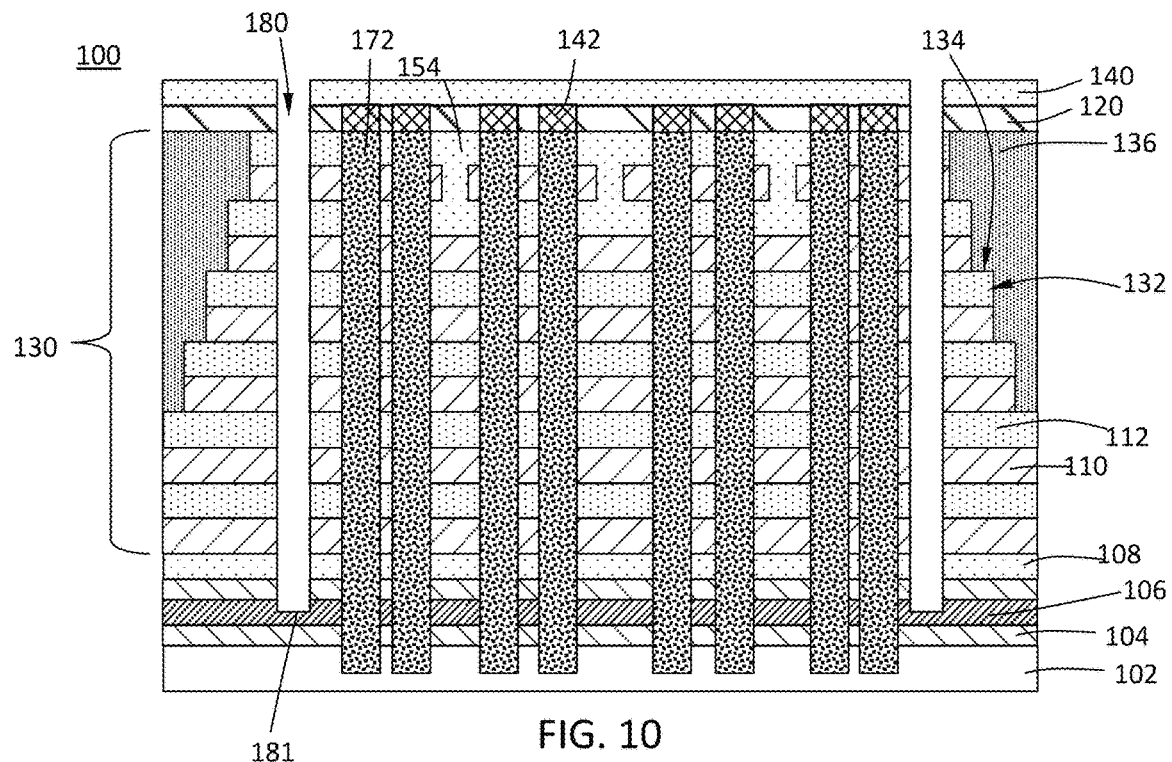
FIG. 10 illustrates a cross-sectional view of an electronic device according to one or more embodiments.

Referring to FIG. 10, at operation 55 of method 10, the memory stack 130 is slit patterned to form slit pattern openings 180 that extend from a top surface of the interlayer dielectric layer 140 to the sacrificial layer 106 of the common source line 103.

Figure 11:
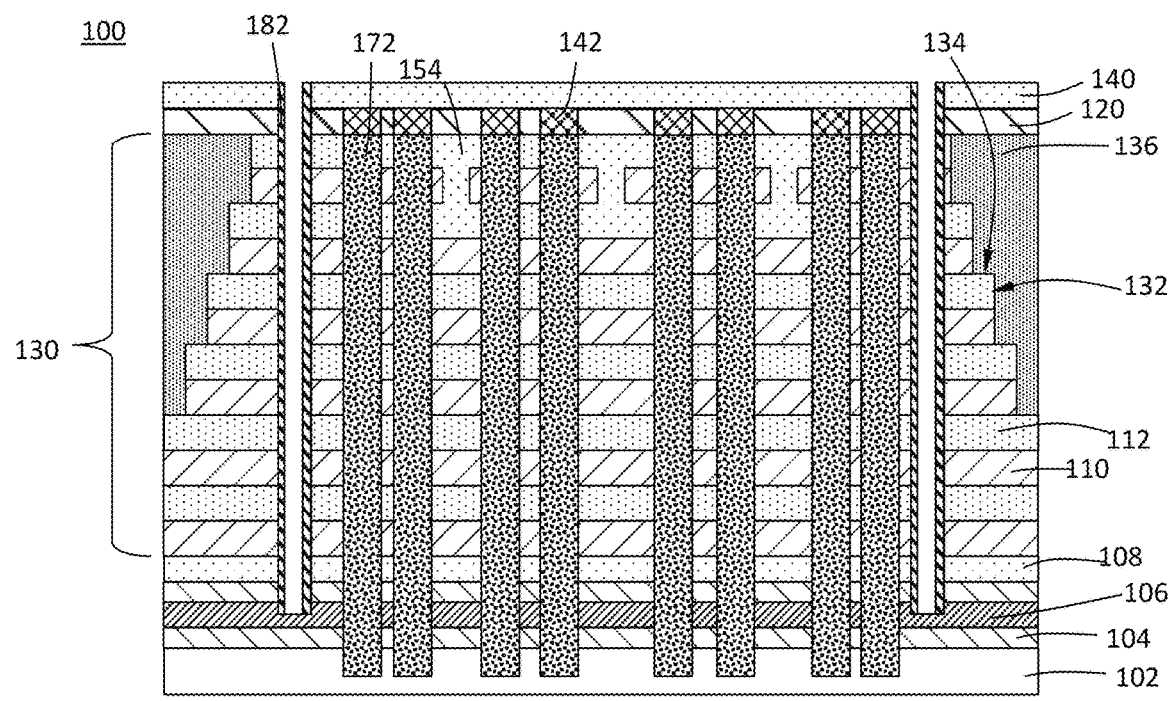
FIG. 11 illustrates a cross-sectional view of an electronic device according to one or more embodiments.

FIG. 11 shows operation 60 where a spacer material 182 is deposited in the slit pattern openings 180 and is then etched back such that the space material 172 is formed on the side walls of the slit pattern openings 180 and not on the bottom surface 181 of the slit pattern opening 180. The spacer material 182 may comprise any suitable material known to the skilled artisan. In one or more embodiments, the spacer material 182 comprises poly-silicon.

Figure 12:
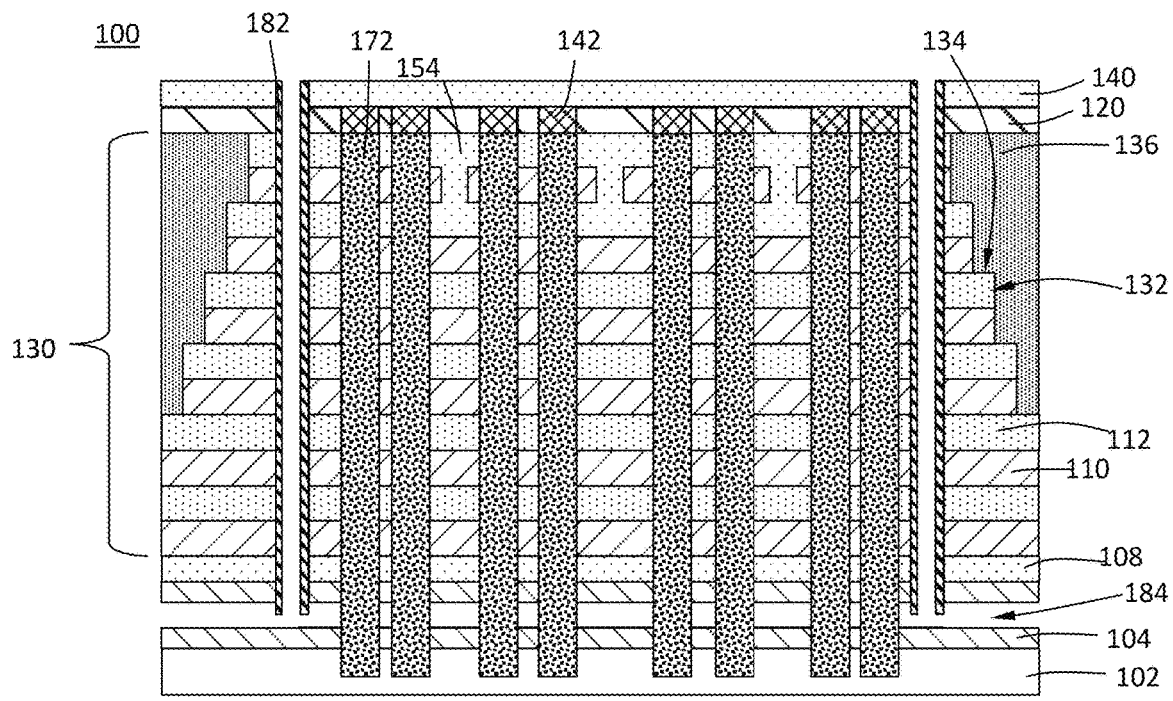
FIG. 12 illustrates a cross-sectional view of an electronic device according to one or more embodiments.

Referring to FIG. 12, shows operation 65 of method 10 where the sacrificial layer 106 in the common source line 103 is removed to form opening 184. The sacrificial layer 106 can be removed by any suitable technique known to the skilled artisan including, but not limited to, selective etching, hot phosphoric acid, and the like.

Figure 13A:
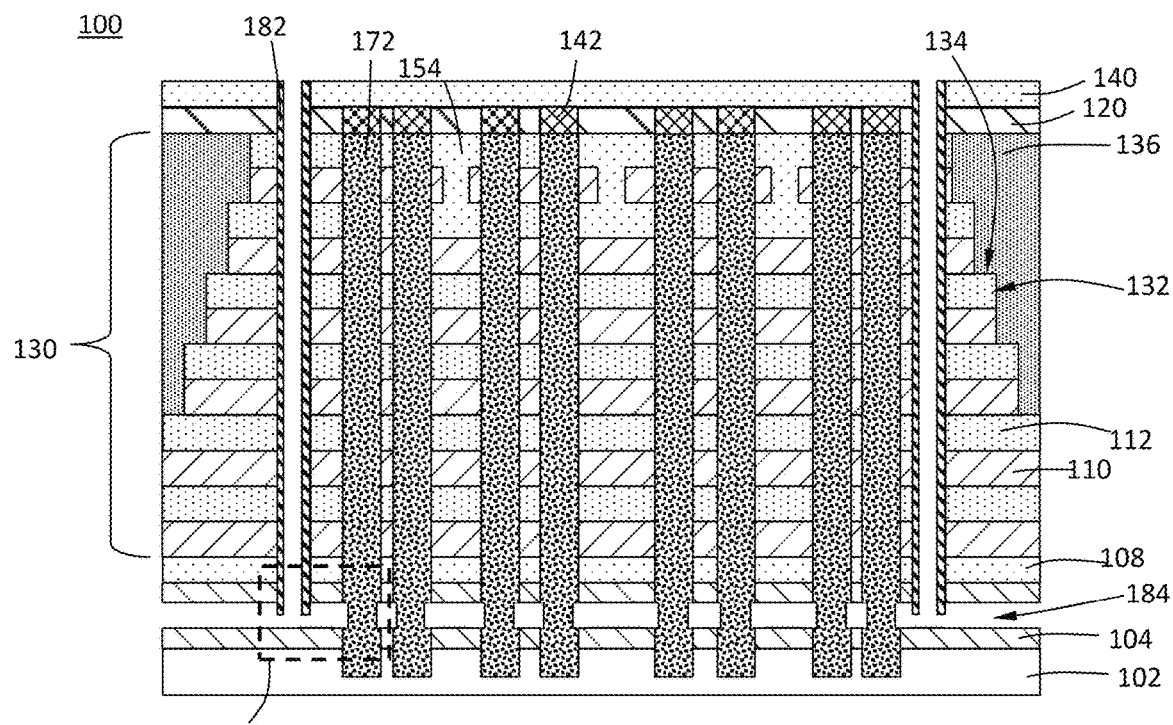
FIG. 13A illustrates a cross-sectional view of an electronic device according to one or more embodiments.
Figure 13B:
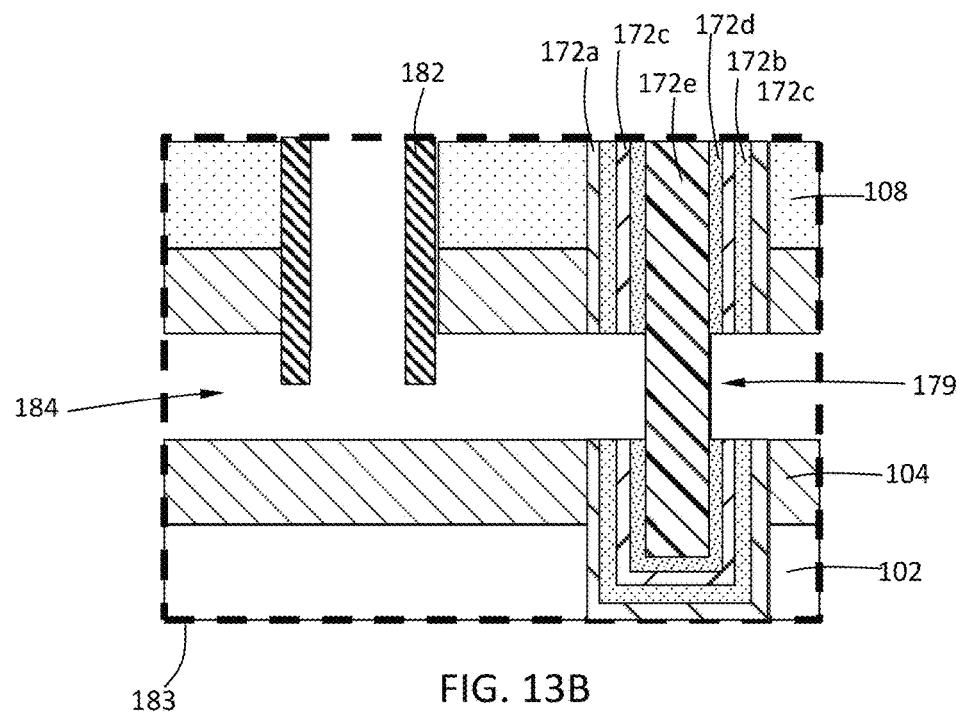
FIG. 13B illustrates an expanded view of region 183 according to one or more embodiments.

FIG. 13A and FIG. 13B, which is an expanded view of region 183 of FIG. 13A, show operation 70 of method 10, where the channel material 172e is exposed to form a common source line contact region 179. The channel material 172e is exposed by removing the aluminum oxide (AlO) layer 172a, the blocking oxide layer 172b, the trap layer 172c, and the tunnel oxide layer 172d in the common source line contact region 179. In one or more embodiments, forming the memory string formation comprises patterning a memory hole extending from the top surface of the memory stack to a bottom surface of the substrate and depositing transistor layers in the memory hole, the transistor layers comprising one or more of an aluminum oxide (AlO) layer, a blocking oxide layer, a trap layer, a tunnel oxide layer, and a channel layer. A bit line pad is formed on a top surface of the memory hole.

Figure 14A:
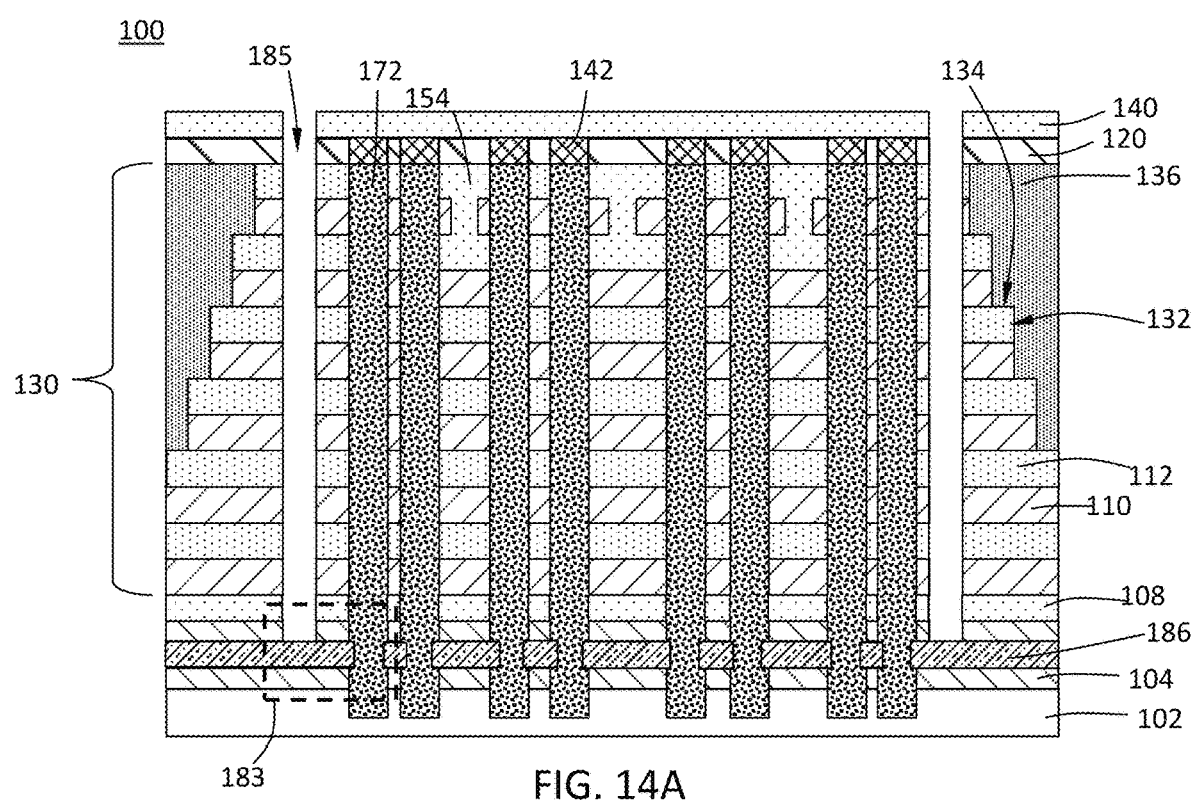
FIG. 14A illustrates a cross-sectional view of an electronic device according to one or more embodiments.
Figure 14B:
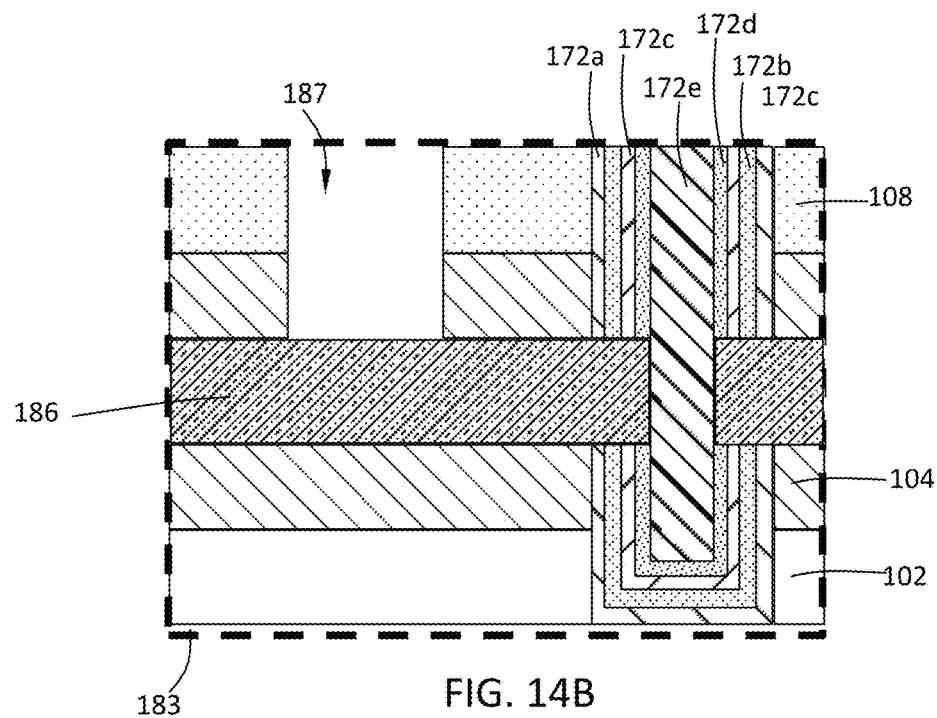
FIG. 14B illustrates an expanded view of region 183 according to one or more embodiments.

FIG. 14A and FIG. 14B, which is an expanded view of region 183 of FIG. 14A, show operation 75 of method 10 where the spacer material 182 is removed from the slit pattern opening 180, and the opening 184, created by removal of the sacrificial layer 106, is filled with a poly-silicon layer 186. The spacer material 182 may be removed by any suitable means known to the skilled artisan. In one or more embodiments, the spacer material 182 is removed by an isotropic etch process (e.g., wet etching using tetramethyl ammonium hydroxide (TMAH) or the like). The poly-silicon layer 186 may be doped or undoped.

Figure 15:
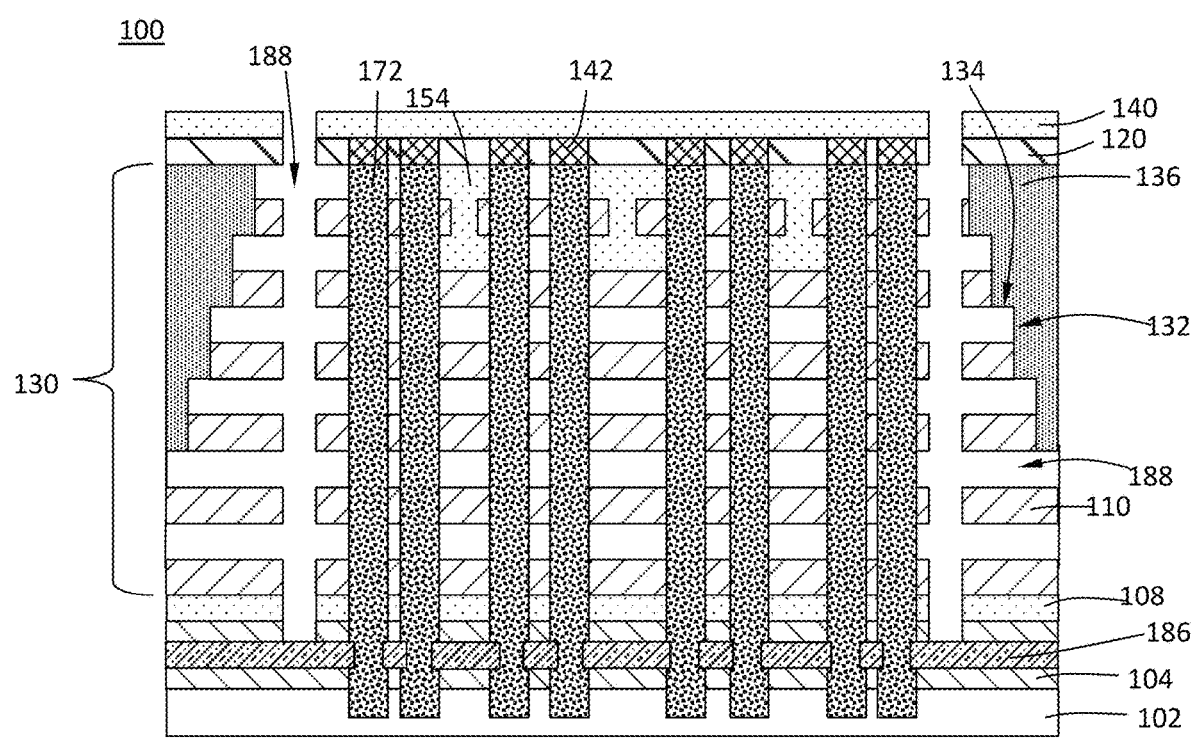
FIG. 15 illustrates a cross-sectional view of an electronic device according to one or more embodiments.

FIG. 15 shows operation 80 of method 10, where the "X" layers or second layers 112 are removed. The second layers 112 may be removed by any suitable means known to the skilled artisan. In one or more embodiments, the second layers 112 are removed by selective etching, e.g., selective wet etching or selective dry etching. Removal of the second layers 112 forms opening 188.

Figure 16A:
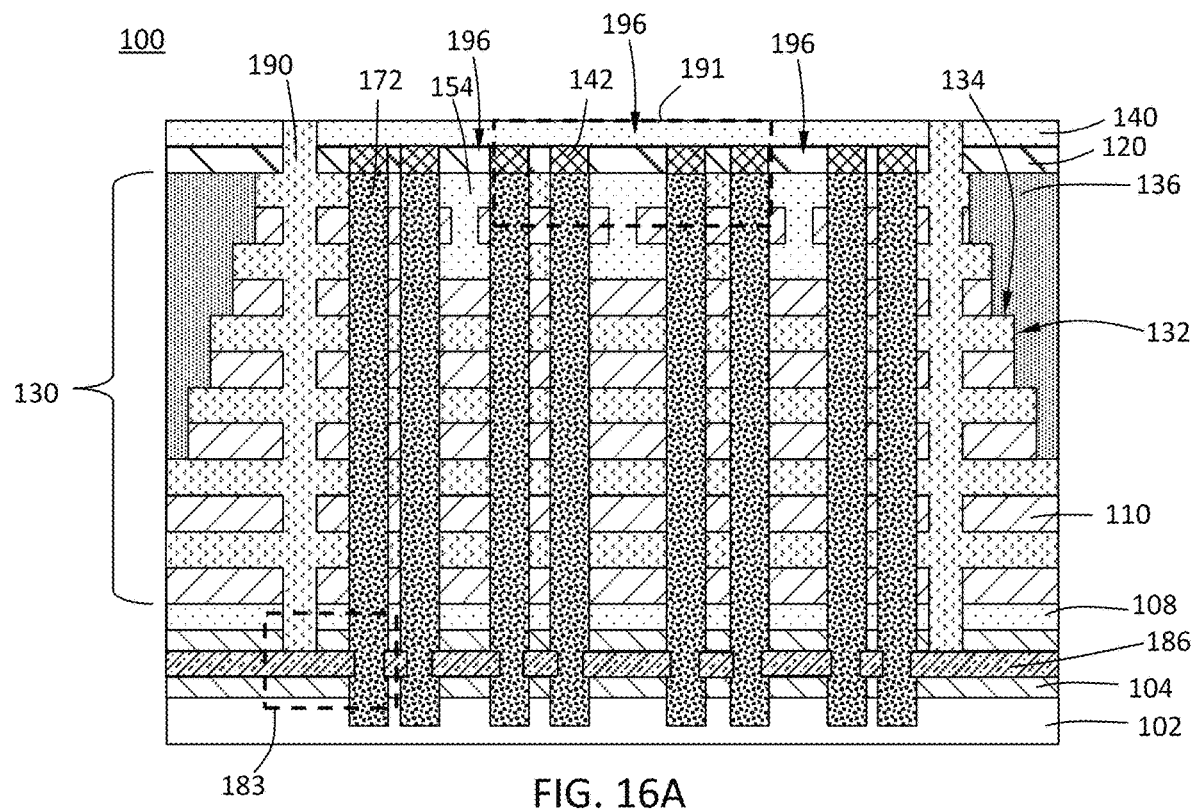
FIG. 16A illustrates a cross-sectional view of an electronic device according to one or more embodiments.
Figure 16B:
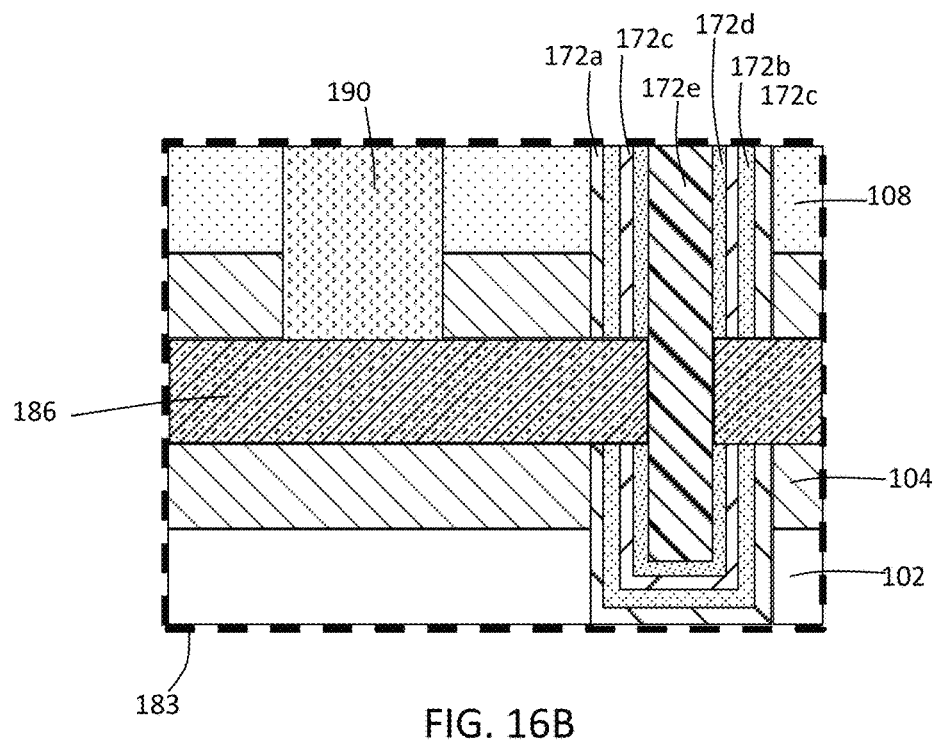
FIG. 16B illustrates an expanded view of region 183 according to one or more embodiments.

Referring to FIGS. 16A and 16B, which is an expanded view of region 183 of FIG. 16A, at operation 85 of method 10, opening 188 is filled with an insulator material 190. The insulator material 190 may comprise any suitable material known to the skilled artisan. In one or more embodiments, the insulator material 190 is selected from one or more of silicon oxide (SiOx), silicon nitride (SiN), and silicon oxynitride ($SiO_xN_y$).

Figure 16C:
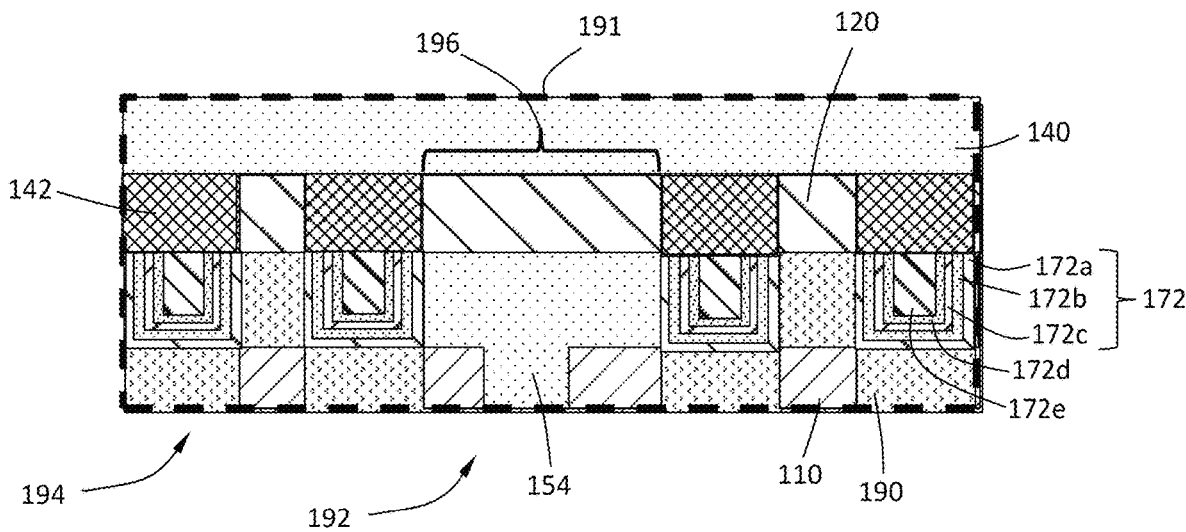
FIG. 16C illustrates an expanded view of region 191 according to one or more embodiments.

FIG. 16C illustrates an expanded view of region 191 of FIG. 16A. Referring to FIG. 16C, in one or more embodiments, there is at least one select gate for drain (SGD) transistor 192 and at least one memory transistor 194 in a vertical hole extending through a memory stack on a substrate. In one or more embodiments, there are at least two select gate for drain (SGD) isolation regions 196 in the memory stack adjacent the filled slit 190.

Figure 17:
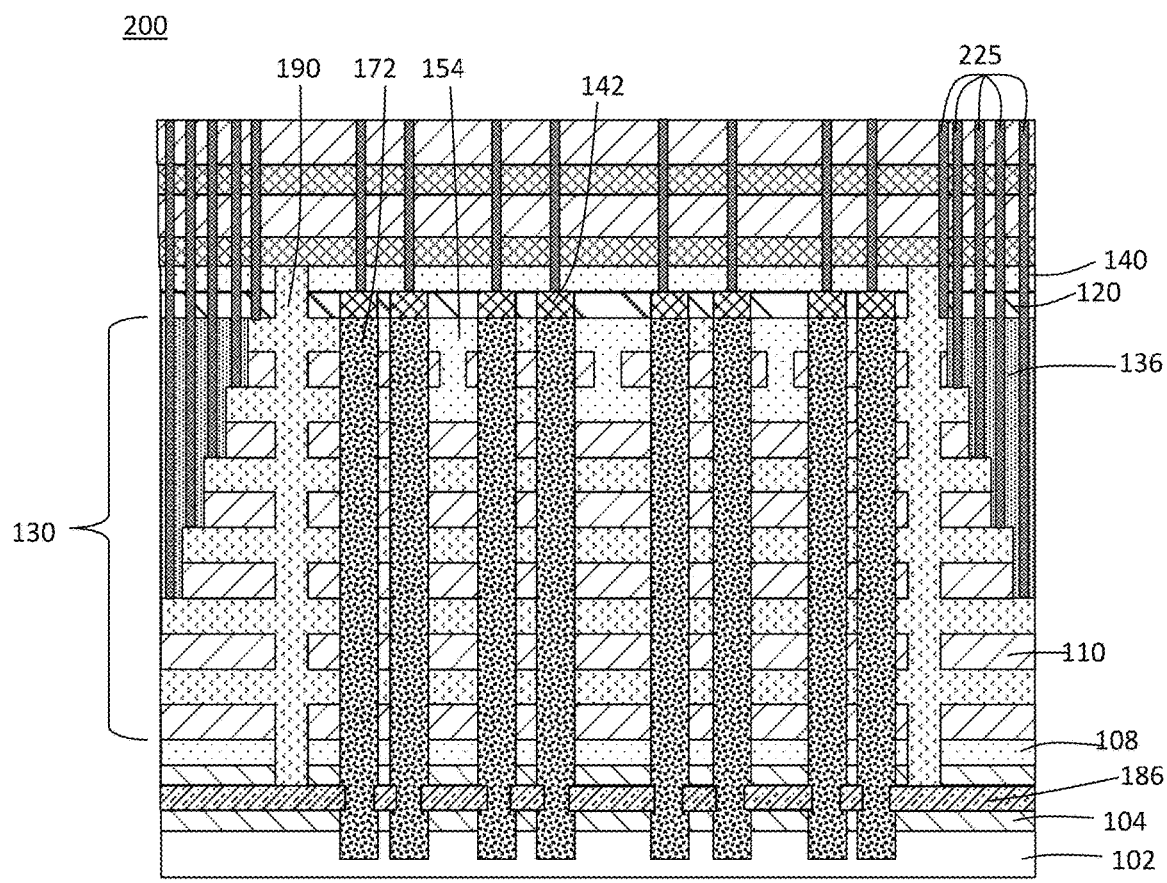
FIG. 17 illustrates a cross-sectional view of an electronic device according to one or more embodiments.

FIG. 17 shows operation 90 of method 10 where the word line (W/L) contacts are formed. The word line contacts 225 extend through the memory stack 130 a distance sufficient to terminate at one of the word lines. In one or more embodiments, the word line contacts 225 can comprise any suitable material known to the skilled artisan. In one or more embodiments, the word line contacts 225 comprises one or more of a metal, a metal silicide, poly-silicon, amorphous silicon, or EPI silicon. In one or more embodiments, the word line contact 225 is doped by either N type dopants or P type dopants in order to reduce contact resistance. In one or more embodiments, the metal of the word line contacts 225 are selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, a semiconductor memory device comprises: a memory string including at least one select gate for drain (SGD) transistor and at least one memory transistor in a vertical hole extending through a memory stack on a substrate, the memory stack comprising alternating non-replacement word line and replacement insulator; a filled slit extending through the memory stack; and at least two selected gate for drain (SGD) isolation regions in the memory stack adjacent the filled slit.

In other embodiments, a method of forming a semiconductor device is provided. The semiconductor device may have a three-dimensional vertical memory string including a select gate for drain (SGD) transistor and a memory transistor. In one or more embodiments, the method of forming a semiconductor device comprises forming a first opening in a memory stack comprising alternating layers of a first layer and a second layer on a substrate; recessing the second layer through the first opening to form a first recessed region; forming a selection-gate-for-drain (SGD) isolation in the first opening and in the first recessed region; forming a memory string formation through the memory stack; forming a slit extending from a top surface of the memory stack to the substrate; removing the second layers to form a second opening; and filling the second opening and the slit with an insulating material.

Figure 18:
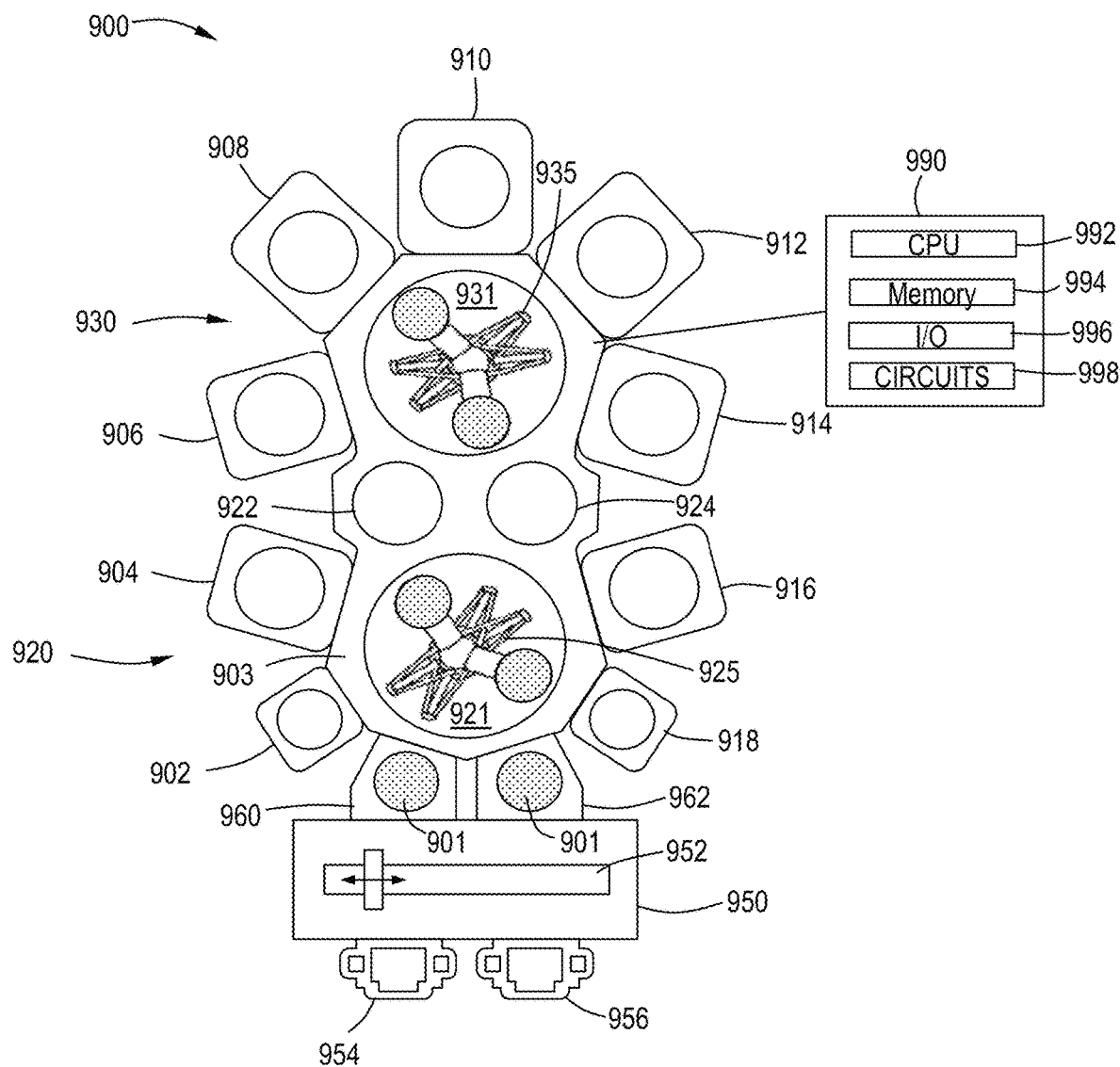
FIG. 18 illustrates a cluster tool according to one or more embodiments.

Additional embodiments of the disclosure are directed to processing tools 900 for the formation of the memory devices and methods described, as shown in FIG. 18.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a word line deposition chamber. The particular arrangement of process chambers and components can be varied depending on the cluster tool and should not be taken as limiting the scope of the disclosure.

In some embodiments, the cluster tool 900 includes a selection-gate-for-drain (SGD) patterning chamber. The selection-gate-for-drain (SGD) patterning chamber of some embodiments comprises one or more selective etching chamber.

In the embodiment shown in FIG. 18, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a selection-gate-for-drain (SGD) patterning chamber; and a controller connected to the central transfer station and the plurality of process stations, the controller configured to activate the robot to move the wafer between process stations, and to control a process occurring in each of the process stations.

One or more embodiments provide a non-transitory computer readable medium including instructions, that, when executed by a controller of a processing chamber, causes the processing chamber to perform the operations of: form a first opening in a memory stack comprising alternating layers of a first layer and a second layer on a substrate; recess the second layer through the first opening to form a first recessed region; form a selection-gate-for-drain (SGD) isolation in the first opening and in the first recessed region; form a memory string formation through the memory stack; form a slit extending from a top surface of the memory stack to the substrate; remove the second layers to form a second opening; and fill the second opening and the slit with an insulating material.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A semiconductor memory device comprising:
   a memory string in a vertical hole extending through a memory stack on a substrate, the memory string comprising at least one select-gate-for-drain (SGD) transistor and at least one memory transistor, the memory stack consisting essentially of alternating layers of an insulator material and a non-replacement word line, the select-gate-for-drain (SGD) transistor comprising the insulator material and the non-replacement word line, the non-replacement word line consisting of a material selected from the group consisting of tungsten (W), molybdenum (Mo), tantalum (Ta), ruthenium (Ru), niobium (Nb), osmium (Os), zirconium (Zr), iridium (Ir), rhenium (Re), titanium (Ti), silicon (Si), silicon germanium (SiGe), and germanium (Ge);
   a filled slit adjacent to the memory string and integral with the memory stack, the filled slit filled with the insulator material; and
   at least two select-gate-for-drain (SGD) isolation regions in the memory stack adjacent to the memory string and the filled slit, the select-gate-for-drain (SGD) isolation regions comprising one or more of silicon oxide ($SiO_x$) or silicon oxynitride (SiON).

2. The semiconductor memory device of claim 1, wherein the select-gate-for-drain (SGD) transistor and the memory transistor independently comprise one or more transistor layers selected from aluminum oxide (AlO), a blocking oxide, a trap material, a tunnel oxide, and a channel material.

3. The semiconductor memory device of claim 1, wherein the insulator material is selected from one or more of silicon oxide, silicon nitride, and silicon oxynitride.

4. The semiconductor memory device of claim 1, wherein the substrate is a common source line, the common source line comprising an oxide layer and a poly-silicon layer.

5. The semiconductor memory device of claim 1, wherein the non-replacement word line consists of tungsten (W).

6. A method of forming a semiconductor device having a three-dimensional vertical memory string including a select-gate-for-drain (SGD) transistor and a memory transistor, the method comprising:
   forming a first opening in a memory stack comprising alternating layers of a first layer and a second layer on a substrate, the first layer selected from the group consisting of tungsten (W), molybdenum (Mo), tantalum (Ta), ruthenium (Ru), niobium (Nb), osmium (Os), zirconium (Zr), iridium (Ir), rhenium (Re), titanium (Ti), silicon (Si), silicon germanium (SiGe), and germanium (Ge);
   recessing the second layer through the first opening to form a first recessed region;
   forming a select-gate-for-drain (SGD) isolation region in the first opening and in the first recessed region, the select-gate-for-drain (SGD) isolation region comprising one or more of silicon oxide ($SiO_x$) or silicon oxynitride (SiON);
   forming a memory string through the memory stack, the memory string comprising at least one select-gate-for-drain (SGD) transistor and at least one memory transistor;;
   forming a slit extending from a top surface of the memory stack to the substrate;
   removing the second layers to form a second opening; and
   filling the second opening and the slit with an insulating material, to form the memory stack consisting essentially of the insulating material and the first layer, and the select-gate-for-drain (SGD) transistor comprising the insulating material and the first layer.

7. The method of claim 6, wherein forming the first opening comprises a select-gate-for-drain (SGD) separation etch.

8. The method of claim 6, wherein forming the select-gate-for-drain (SGD) isolation comprises depositing an oxide material in the first opening and in the first recessed region.

9. The method of claim 6, wherein forming the memory string formation comprises:
   patterning a memory hole extending from the top surface of the memory stack to a bottom surface of the substrate;
   depositing transistor layers in the memory hole, the transistor layers comprising one or more of an aluminum oxide (AlO) layer, a blocking oxide layer, a trap layer, a tunnel oxide layer, and a channel layer; and
   forming a bit line pad on a top surface of the memory hole.

10. The method of claim 9, wherein the first opening has a pitch in a range of from about 20 nm to about 60 nm, and the second layer is recessed an amount that is about 100 nm to about 300 nm, about two times the pitch of the memory hole.

11. The method of claim 9, further comprising depositing a spacer material in the slit.

12. The method of claim 11, wherein the substrate is a common source line, the common source line comprising a sacrificial layer, and a poly-silicon layer, and the method further comprises removing the sacrificial layer from the common source line to form a common source opening.

13. The method of claim 12, further comprising exposing the channel layer through the common source opening.

14. The method of claim 6, further comprising forming word line contacts.

15. A non-transitory computer readable medium including instructions, that, when executed by a controller of a processing chamber, causes the processing chamber to perform the operations of:
    form a first opening in a memory stack comprising alternating layers of a first layer and a second layer on a substrate, the first layer from the group consisting of tungsten (W), molybdenum (Mo), tantalum (Ta), ruthenium (Ru), niobium (Nb), osmium (Os), zirconium (Zr), iridium (Ir), rhenium (Re), titanium (Ti), silicon (Si), silicon germanium (SiGe), germanium (Ge), and combinations thereof;
    recess the second layer through the first opening to form a first recessed region;
    form a select-gate-for-drain (SGD) isolation in the first opening and in the first recessed region, the select-gate-for-drain (SGD) isolation region comprising one or more of silicon oxide ($SiO_x$) or silicon oxynitride (SiON);
    form a memory string formation through the memory stack;
    form a slit extending from a top surface of the memory stack to the substrate;
    remove the second layers to form a second opening; and
    fill the second opening and the slit with an insulating material to form the memory stack consisting essentially of the insulating material and the first layer, and the select-gate-for-drain (SGD) transistor comprising the insulating material and the first layer.

16. The method of claim 6, wherein the second layer comprises one or more of a metal, a metal nitride, a conductive metal compound, and a semiconductor material.

17. The method of claim 16, wherein the metal is selected from one or more of tungsten (W), molybdenum (Mo), tantalum (Ta), niobium (Nb), osmium (Os), zirconium (Zr), iridium (Ir), rhenium (Re), or titanium (Ti).

18. The method of claim 16, wherein the metal nitride is selected from one or more of titanium nitride (TiN), tantalum nitride (TaN), tungsten nitride (WN), molybdenium nitride (MoN), and zirconium nitride (ZrN).

19. The method of claim 16, wherein the conductive metal compound is selected from one or more of tungsten oxide (WOx), ruthenium oxide (RuOx), and iridium oxide (IrOx) and the semiconductor material is selected from one or more of silicon (Si), silicon germanium (SiGe), and germanium (Ge).

* * * * *